US010076065B2

(12) United States Patent
Huang et al.

(10) Patent No.: US 10,076,065 B2
(45) Date of Patent: Sep. 11, 2018

(54) LIQUID COOLING SYSTEM WITH A DISPLACEMENT APPENDAGE FOR AN INFORMATION HANDLING SYSTEM

(71) Applicant: DELL PRODUCTS, LP, Round Rock, TX (US)

(72) Inventors: Chin-An Huang, Taipei (TW); Austin M. Shelnutt, Leander, TX (US); Chia-Chuan Yu, New Taipei (TW)

(73) Assignee: DELL PRODUCTS, LP, Round Rock, TX (US)

( * ) Notice: Subject to any disclaimer, the term of this patent is extended or adjusted under 35 U.S.C. 154(b) by 0 days.

(21) Appl. No.: 15/398,173

(22) Filed: Jan. 4, 2017

(65) Prior Publication Data

US 2018/0192553 A1    Jul. 5, 2018

(51) Int. Cl.
*H05K 7/20* (2006.01)
*F28F 27/00* (2006.01)

(52) U.S. Cl.
CPC ......... *H05K 7/20809* (2013.01); *F28F 27/00* (2013.01); *H05K 7/20336* (2013.01); *F28F 2265/14* (2013.01)

(58) Field of Classification Search
CPC ............. H01L 23/473; H01L 21/67017; H01L 21/67109; H05K 7/20809; H05K 7/20818; H05K 7/20327; H05K 7/203; H05K 7/20772; H05K 7/20281; H05K 7/20827; H05K 7/20236; H05K 7/20272; H05K 7/20318; H05K 7/20763; H05K 7/208; H05K 1/20; G06F 3/016; G06F 2200/201; G06F 7/20336; F28F 27/00; F28F 2265/14
See application file for complete search history.

(56) References Cited

U.S. PATENT DOCUMENTS

| | | | |
|---|---|---|---|
| 6,942,018 B2 * | 9/2005 | Goodson | F04B 19/006 165/104.21 |
| 7,000,684 B2 * | 2/2006 | Kenny | F04B 17/00 165/104.21 |
| 2007/0029070 A1 * | 2/2007 | Yamamoto | F04B 43/021 165/104.28 |
| 2007/0279861 A1 * | 12/2007 | Doll | G06F 1/20 361/679.48 |
| 2009/0293461 A1 * | 12/2009 | Miyagawa | F01N 3/043 60/299 |
| 2012/0180979 A1 * | 7/2012 | Harrington | F28D 1/0246 165/11.1 |
| 2014/0206204 A1 * | 7/2014 | Nakagawa | F01K 25/14 438/795 |
| 2014/0216085 A1 * | 8/2014 | Kawakami | B60H 1/00278 62/190 |
| 2015/0029658 A1 * | 1/2015 | Yairi | G06F 1/20 361/679.47 |
| 2015/0062803 A1 | 3/2015 | Lin et al. | |
| 2016/0118317 A1 * | 4/2016 | Shedd | F25B 23/006 257/712 |
| 2016/0238040 A1 * | 8/2016 | Gallo | G06F 3/016 |

* cited by examiner

*Primary Examiner* — Adam B Dravininkas
(74) *Attorney, Agent, or Firm* — Larson Newman, LLP

(57) ABSTRACT

A liquid cooling system for a server includes a heat pipe and a displacement appendage fluidly coupled to the heat pipe. The displacement appendage includes a displacement element which is compressible under pressure.

15 Claims, 3 Drawing Sheets

LIQUID COOLING SYSTEM WITH A DISPLACEMENT APPENDAGE FOR AN INFORMATION HANDLING SYSTEM

FIELD OF THE DISCLOSURE

This disclosure generally relates to information handling systems, and more particularly relates to a liquid cooling system with a displacement appendage for an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The following description in combination with the Figures is provided to assist in understanding the teachings disclosed herein. The use of the same reference symbols in different drawings indicates similar or identical items.

SUMMARY

A liquid cooling system for a server includes a heat pipe and a displacement appendage fluidly coupled to the heat pipe. The displacement appendage has a displacement element that is compressible under pressure.

DETAILED DESCRIPTION OF DRAWINGS

Figure 1:
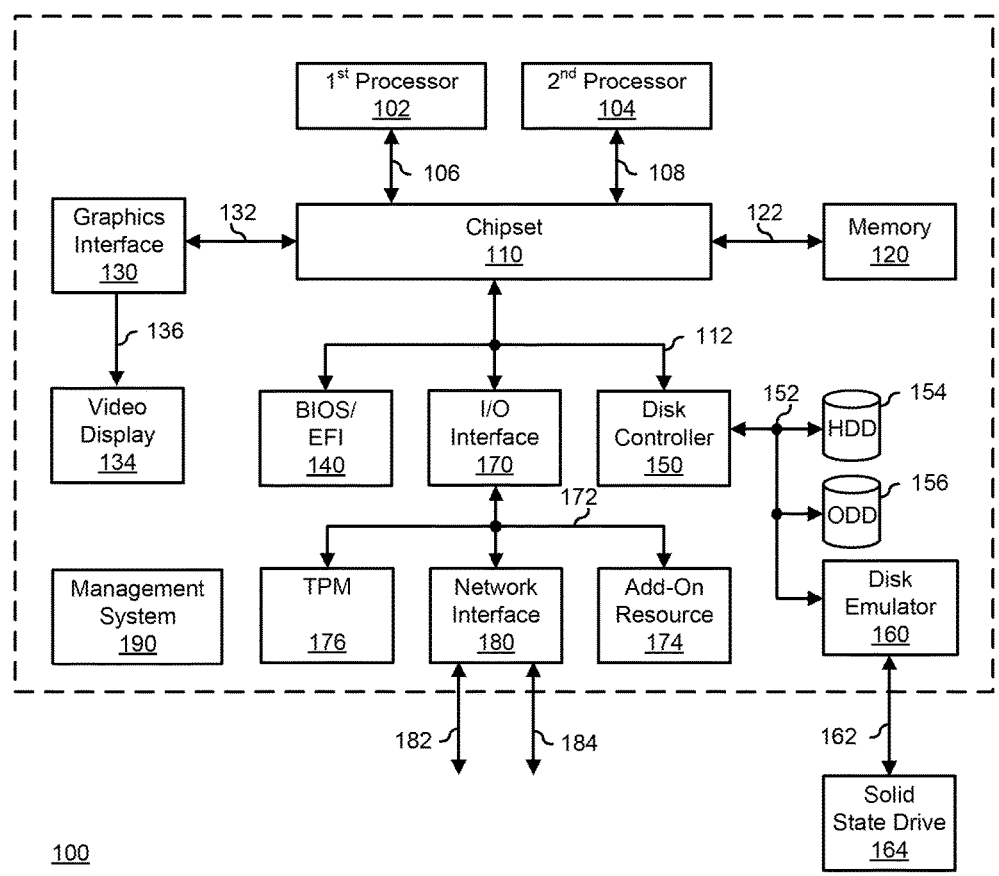
FIG. 1 is a block diagram of a generalized information handling system according to an embodiment of the present disclosure.

FIG. 1 illustrates a generalized embodiment of information handling system 100. For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 100 can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

Information handling system 100 can include devices or modules that embody one or more of the devices or modules described above, and operates to perform one or more of the methods described above. Information handling system 100 includes processors 102 and 104, a chipset 110, a memory 120, a graphics interface 130, include a basic input and output system/extensible firmware interface (BIOS/EFI) module 140, a disk controller 150, a disk emulator 160, an input/output (I/O) interface 170, a network interface 180, and a management system 190. Processor 102 is connected to chipset 110 via processor interface 106, and processor 104 is connected to the chipset via processor interface 108. Memory 120 is connected to chipset 110 via a memory bus 122. Graphics interface 130 is connected to chipset 110 via a graphics interface 132, and provides a video display output 136 to a video display 134. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 140 includes BIOS/EFI code operable to detect resources within information handling system 100, to provide drivers for the resources, initialize the resources, and access the resources. BIOS/EFI module 140 includes code that operates to detect resources within information handling system 100, to provide drivers for the resources, to initialize the resources, and to access the resources.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1394 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174, to a TPM 176, and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a NIC disposed within information handling system 100, on a main circuit board of the information handling system, integrated onto another component such as chipset 110, in another suitable location, or a combination thereof. Network interface device 180 includes network channels 182 and 184 that provide interfaces to devices that are external to information handling system 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniBand channels, Fibre Channel channels, Gigabit Ethernet channels, proprietary channel architectures, or a combination thereof. Network channels 182 and 184 can be connected to external network resources (not illustrated). The network resource can include another information handling system, a data storage system, another network, a grid management system, another suitable resource, or a combination thereof.

Management system 190 provides for out-of-band monitoring, management, and control of the respective elements of information handling system 100, such as cooling fan speed control, power supply management, hot-swap and hot-plug management, firmware management and update management for system BIOS or UEFI, Option ROM, device firmware, and the like, or other system management and control functions as needed or desired. As such, management system 190 provides some or all of the functions and features of the management systems, management controllers, embedded controllers, or other embedded devices or systems, as described herein.

An information handling system may subsume multiple information handling systems. For example, a server system may include a server rack supporting multiple servers in the racks of the server rack. One or more of the servers may be cooled with a liquid cooling system. A server rack supporting such a liquid cooled server may have provisions for providing cooling liquid to the cooling system when the server is inserted into one of the racks. For example, the server rack may have provisions for providing liquid to a liquid cooling system in one or more of the racks. The provisions may include a coupling mechanism for providing liquid to the liquid cooling system of the server.

Figure 2:
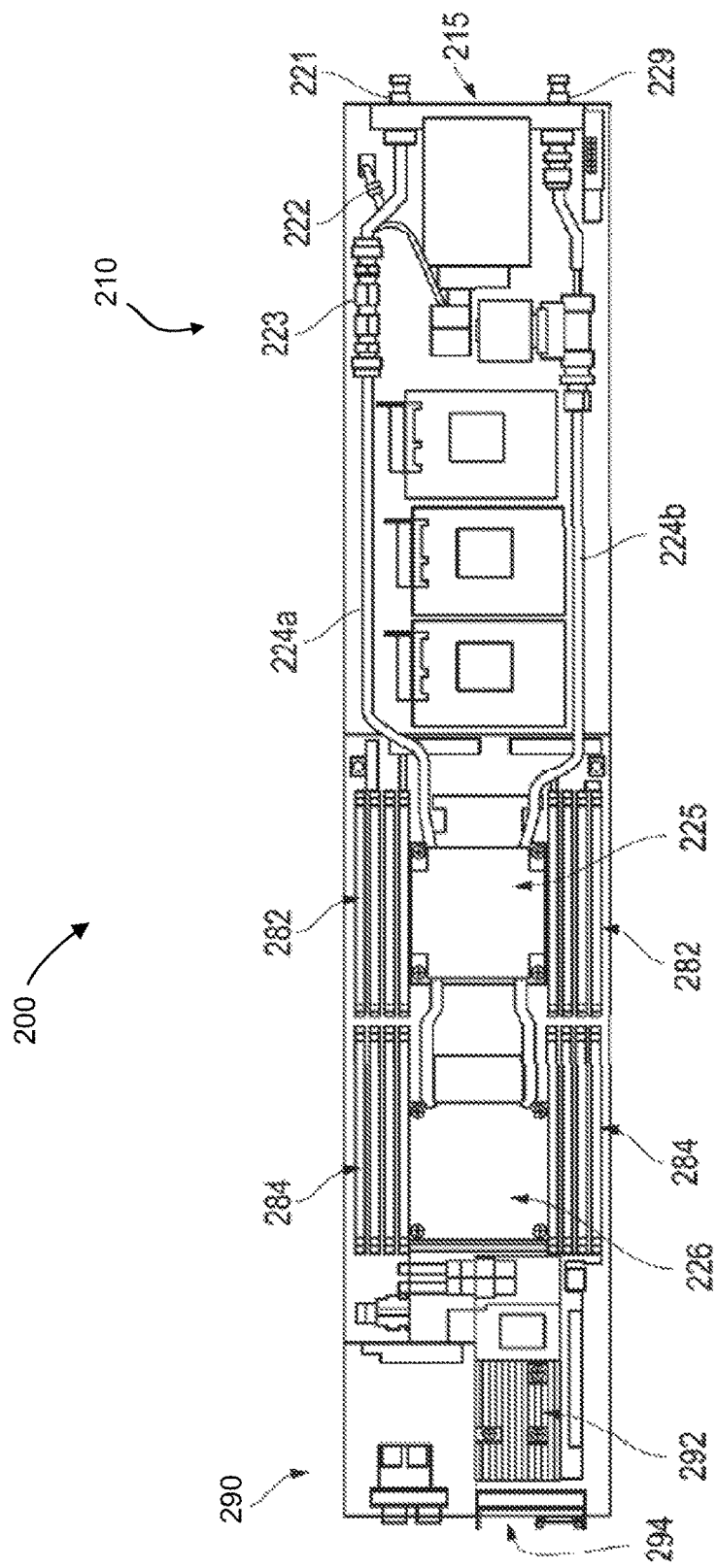
FIG. 2 is a block diagram of an information handling system with a liquid cooling system according to an embodiment of the present disclosure.

FIG. 2 shows a server 200 with a liquid cooling system. Server 200 has a distal end 210 and a proximal end 290. Distal end 210 couples server 200 to the server rack and includes server connector 215 which electrically connects server 200 with the server rack when server 200 is inserted into the server rack. Proximal end 290 includes input and output circuitry 292, and input and output connections 294 which allow for coupling input and output circuitry 292 with one or more external devices. Server 200 further includes processing elements 282 and 284 which generate heat in operation and which are cooled by the liquid cooling system of server 200. Namely, heat generated by processing elements 282 and 284 is dissipated by the liquid cooling system of server 200.

The liquid cooling system of server 200 includes liquid coupling 221, displacement appendage 222, check valve 223, heat pipe 224, heat exchangers 225 and 226, and liquid coupling 229. Heat pipe 224 provides a contained path for cooling liquid to flow into server 200 and the liquid cooling system via liquid coupling 221, traverse heat exchangers 225 and 226, and exit server 200 and the liquid cooling system via liquid coupling 229. Liquid couplings, such as the Staubli CGD03 (CGO and CDO) liquid couplings by Staubli Group of Pfäffikon, Switzerland, may be used to provide liquid to and remove liquid from a coupled liquid cooling system of a server. Liquid coupling 221 may be a quick disconnect coupling and may be a female coupling that couples to a corresponding male coupling provided by a corresponding server rack for server 200. Liquid coupling 221 receives cooling liquid, such as water, from the corresponding coupling of the server rack when coupled to the corresponding coupling of the server rack. The cooling liquid traverses check valve 223 and enters heat exchangers 225 and 226 via heat pipe 224, namely heat pipe portion 224a. Check valve 223 functions as a one-way valve allowing liquid to flow towards exchangers 225 and 226 and as such prevents the cooling liquid entering heat pipe portion 224a from flowing back towards liquid coupling 221 from heat pipe portion 224a.

The cooling liquid in heat exchangers 225 and 226 absorbs heat generated by processing elements 282 and 284 and passes out liquid coupling 229 via heat pipe 224, namely heat pipe portion 224b. That is, cooling liquid exits heat exchangers 225 and 226, and enters heat pipe portion 224b which guides the (heated) cooling liquid to and out of liquid coupling 229. Liquid coupling 229 may be a quick disconnect coupling and may be a female coupling that couples to a corresponding male coupling provided by a corresponding server rack for server 200 such that the heated cooling liquid exits server 200 and enters a liquid disposal system provided by the server rack.

Embodiments of cooling liquids may be relatively incompressible. For example, water is empirically incompressible when used in liquid cooling systems such as described with regard to FIG. 2. The incompressibility of cooling liquid may cause difficulties when coupling the liquid cooling system of server 200 to the server rack because the liquid cooling system may be filled with cooling liquid such that liquid couplings 221 and 229 are prevented from a coupling displacement by the (empirically) incompressible cooling liquid. Displacement appendage 222 is appended to the liquid cooling system and provides a displacement mechanism for the cooling liquid contained within the liquid cooling system to be displaced to allow for coupling liquid couplings 221 and 229 to corresponding couplings provided by the server rack.

Displacement appendage 222 may include a compressible displacement element which may be an elastically compressible displacement element which compresses under pressure to allow for a volumetric displacement interior to the liquid cooling system. As shown in FIG. 2, displacement appendage 222 is appended to the liquid cooling system of server 200 in the region between liquid coupling 221 and check valve 223. More particularly, displacement appendage 222 is appended to heat pipe 224 between liquid coupling 221 and check valve 223. Displacement appendage 222 may be appended to heat pipe 224 by brazing or may be formed by an extrusion of heat pipe 224. Displacement appendage 222 may be coupled to heat pipe 224 by a coupling such that displacement appendage 222 is appended to heat pipe 224.

Figure 3:
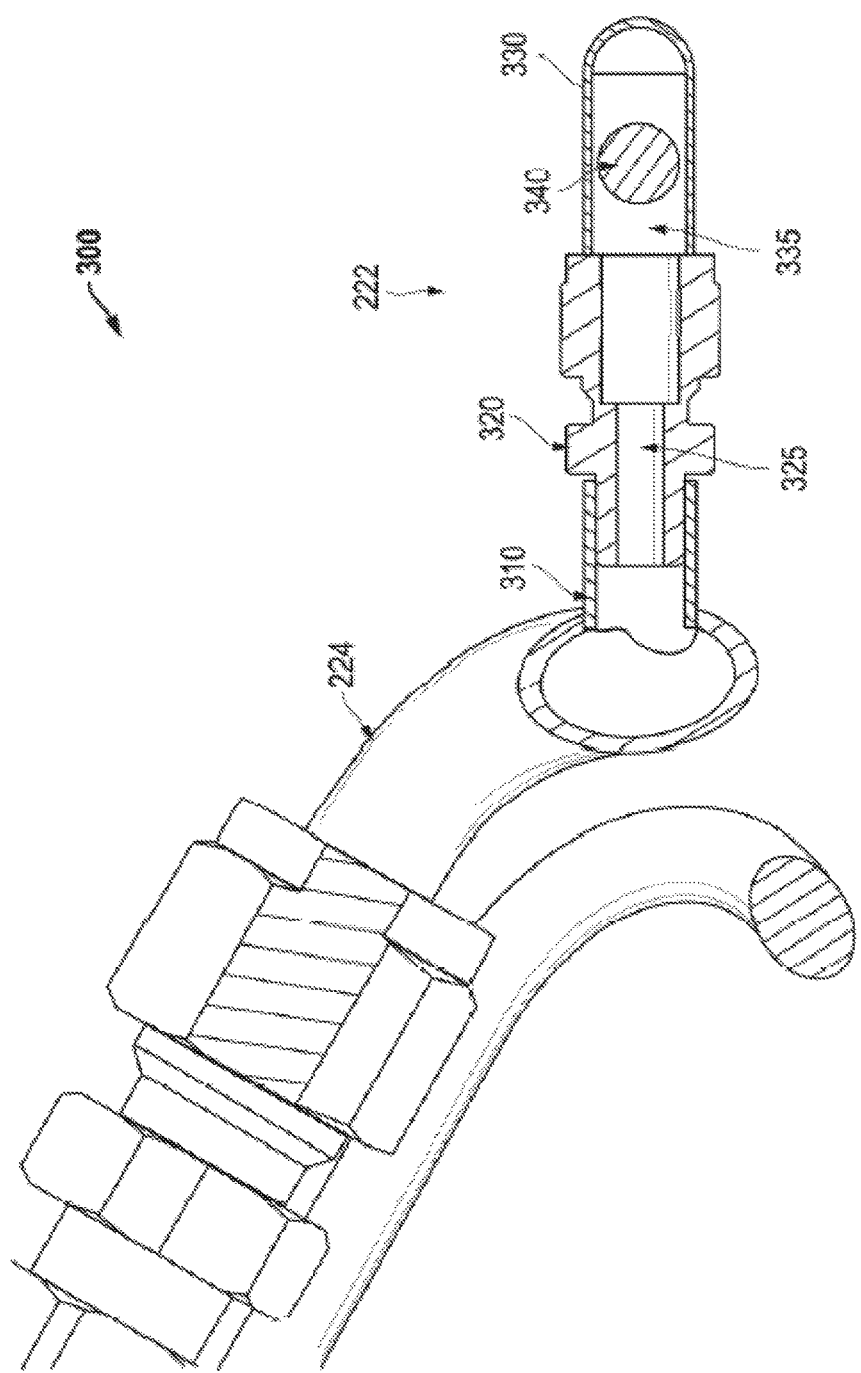
FIG. 3 is a block diagram of a portion of a liquid cooling system including a displacement appendage according to an embodiment of the present disclosure.

FIG. 3 illustrates an embodiment 300 of displacement appendage 222 appended to heat pipe 224. Displacement appendage 222 comprises extrusion 310, coupling 320, encapsulation 330, and displacement element 340. Extrusion 310 is extruded from or brazed to heat pipe 224 and provides a point of fluid coupling to heat pipe 224 and the corresponding liquid cooling system generally. Coupling 320 fluidly couples encapsulation 330 to extrusion 310 such that encapsulation 330 is fluidly coupled to heat pipe 224 and the corresponding liquid cooling system. Coupling 320 has a through-hole 325 with an interior diameter. Encapsulation 330 encapsulates displacement element 340 by providing an encapsulation chamber 335 containing displacing element 340. That is, encapsulation 330 defines encapsulation chamber 335 which encompasses displacement element 340. Encapsulation chamber 335 is in fluid communication with heat pipe 224 and the corresponding liquid cooling system generally via coupling 320 and extrusion 310.

As discussed above, displacement element 340 is a compressible displacement element which may be an elastically compressible displacement element which compresses under pressure to allow for a volumetric displacement of incompressible liquid interior to the liquid cooling system. More particularly, liquid under pressure may compress compressible displacement element 340 to allow for volumetric displacement of incompressible liquid interior to the liquid cooling system. That is, encapsulation chamber 335 is fluidly coupled to heat pipe 224 via coupling 320. Thus fluid under pressure in the liquid cooling system may act on compressible displacement element 340 relative to the pressure to compress compressible displacement element 340 in size, thereby allowing for a volumetric displacement of incompressible liquid interior to the liquid cooling system based on pressure.

As shown in FIG. 3, displacement element 340 may be constrained to remain in encapsulation chamber 335 because displacement element 340 may be larger in size than through-hole 325 such that coupling 320 functions as a retaining element confining or retaining displacement element 340 in encapsulation chamber 335. A separate retaining element may also be used to retain displacement element 340 in encapsulation chamber 335. In the embodiment illustrated in FIG. 3, displacement element 340 may have a diameter of 4.5 mm and through-hole 325 of coupling 320 may have a smaller diameter of 3 mm such that displacement element 340 cannot traverse coupling 320 because displacement element 340 is too large to traverse through-hole 325. Encapsulation chamber 335 may have a diameter of 6 mm to encapsulate displacement element 340 and allow for a compressible deformation of displacement element 340. Heat pipe 224 may have a diameter of 8 mm.

As discussed above, displacement element 340 may be an elastically compressible displacement element which returns to shape after a compression. While shown as a ball in FIG. 3, this is by way of illustration, and other configurations of displacement element 340 may be used. The displacement element may be hollow or may be a solid element formed of compressible material. In one embodiment, displacement element 340 may be made of Hydrogenated Nitrile Butadiene Rubber. Encapsulation 330 and extrusion 310 may be formed of copper.

The preceding discussion focused on specific implementations and embodiments of the teachings. This focus has been provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A liquid cooling system for a server, comprising:
 a heat pipe;
 a displacement appendage fluidly coupled to the heat pipe, the displacement appendage including a displacement element that is compressible under a pressure;

a liquid coupling fluidly coupled to the heat pipe and configured to receive cooling liquid; and a check valve coupled to the heat pipe, wherein the displacement appendage is positioned between the check valve and the liquid coupling.

2. The liquid cooling system of claim 1, further comprising:

an encapsulation forming a portion of the displacement appendage, wherein the encapsulation defines an encapsulation chamber, the encapsulation chamber encompassing the displacement element.

3. The liquid cooling system of claim 2, wherein the encapsulation chamber is in fluid communication with the heat pipe.

4. The liquid cooling system of claim 3, wherein a portion of the displacement appendage is extruded from the heat pipe.

5. The liquid cooling system of claim 2, wherein the displacement element is an elastically compressible displacement element.

6. The liquid cooling system of claim 2, further comprising:

a coupling providing a fluid coupling fluidly coupling the encapsulation chamber to the heat pipe, wherein a size of the fluid coupling is smaller than a size of the displacement element.

7. A server comprising:

a plurality of processing elements;

a liquid cooling system including a heat pipe fluidly coupled to a liquid coupling for receiving cooling fluid to absorb heat generated by the processing elements;

a displacement appendage appended to the heat pipe and fluidly coupled to the heat pipe, the displacement appendage including a displacement element that is compressible under a pressure; and an encapsulation forming a portion of the displacement appendage, wherein the encapsulation defines an encapsulation chamber, the encapsulation chamber encompassing the displacement element and wherein:

the encapsulation chamber is in fluid communication with the heat pipe; and a portion of the displacement appendage is extruded from the heat pipe.

8. The server of claim 7, wherein the displacement element is an elastically compressible displacement element.

9. The server of claim 8, wherein the liquid coupling couples to a server rack.

10. The server of claim 7, further comprising:

a coupling providing a fluid coupling fluidly coupling the encapsulation chamber to the heat pipe, wherein a size of the fluid coupling is smaller than a size of the displacement element.

11. The server of claim 7, further comprising a check valve, the check valve coupled to the heat pipe, wherein the displacement appendage is positioned between the check valve and the liquid coupling.

12. A liquid cooling system for a server, comprising:

a heat pipe;

a first liquid coupling coupled to the heat pipe and configured to receive cooling liquid from a server rack;

a second liquid coupling coupled to the heat pipe and configured to provide cooling liquid to the server rack;

a heat exchanger coupled to the heat pipe between the first liquid coupling and the second liquid coupling; and a displacement appendage appended to the heat pipe and fluidly coupled to the heat pipe, the displacement appendage including a displacement element and an encapsulation defining an encapsulation chamber encompassing the displacement element, wherein the displacement element is compressible under a pressure.

13. The liquid cooling system of claim 12, wherein the encapsulation chamber is in fluid communication with the heat pipe.

14. The liquid cooling system of claim 12, further comprising:

a coupling providing a fluid coupling fluidly coupling the encapsulation chamber to the heat pipe, wherein a size of the fluid coupling is smaller than a size of the displacement element.

15. The liquid cooling system of claim 14, further comprising a check valve, the check valve coupled to the heat pipe, wherein the displacement appendage is positioned between the check valve and the first liquid coupling.

* * * * *